United States Patent [19]
Bockelman et al.

[11] Patent Number: 5,379,008
[45] Date of Patent: Jan. 3, 1995

[54] VARIABLE IMPEDANCE CIRCUIT PROVIDING REDUCED DISTORTION

[75] Inventors: David E. Bockelman, Lauderhill; Robert E. Stengel, Ft. Lauderdale, both of Fla.; Kenneth D. Cornett, Albuquerque, N. Mex.

[73] Assignee: Motorola, Inc., Schaumburg, Ill.

[21] Appl. No.: 25,458

[22] Filed: Mar. 3, 1993

[51] Int. Cl.[6] .................. H03H 7/00; H03H 5/12
[52] U.S. Cl. ...................... 333/174; 334/15
[58] Field of Search ............... 333/172, 174; 334/78, 334/65, 14, 15; 330/149; 455/295, 307, 191.1, 191.2

[56] References Cited

U.S. PATENT DOCUMENTS

| | | | |
|---|---|---|---|
| 3,217,096 | 11/1965 | Caprio et al. | 455/307 X |
| 3,723,884 | 3/1973 | Asplin | 455/307 |
| 4,588,958 | 5/1986 | Katz et al. | 330/149 |
| 4,839,617 | 6/1989 | Speake | 333/174 |
| 5,166,646 | 11/1992 | Avanic et al. | 331/107 A |
| 5,173,835 | 12/1992 | Cornett et al. | 257/310 |

FOREIGN PATENT DOCUMENTS

| | | | |
|---|---|---|---|
| 0199308 | 9/1986 | Japan . | |
| 0170212 | 7/1989 | Japan | 334/78 |

OTHER PUBLICATIONS

Article: "Distortion in Variable-Capacitance Diodes" by Robert G. Meyer and Mark L. Stephens, IEEE Journal of Solid-State Circuits, vol. SC-10, No. 1, Feb. 1975 (pp. 47-54).

*Primary Examiner*—Seungsook Ham
*Attorney, Agent, or Firm*—Pedro P. Hernandez

[57] ABSTRACT

An electronic circuit (300) includes first (302) and second (304) variable impedance devices coupled together. The first (302) and second (304) variable impedance devices are designed such that each exhibits a transfer function which is substantially inverse with respect to the other about the operating point of the electronic circuit. This provides for an electronic circuit which exhibits very low distortion characteristics. Circuits such as tunable filters, voltage-controlled oscillators (VCOs), receivers, etc. will benefit from using an electronic circuit (300) which exhibits such low distortion characteristics.

7 Claims, 4 Drawing Sheets

600

VARIABLE IMPEDANCE CIRCUIT PROVIDING REDUCED DISTORTION

TECHNICAL FIELD

This invention relates in general to electronic circuits, and more specifically to an electronic circuit which exhibits reduced distortion characteristics utilizing variable impedance devices such as voltage variable capacitors.

BACKGROUND

Variable impedance devices such as voltage variable capacitors (VVCs), variable inductors, etc. which are used in applications such as radio circuits, show poor intermodulation distortion (IMD) characteristics. For example, the larger the tuning ratio that a VVC has, the worse the IMD characteristics the circuit will exhibit. In circuits such as tunable filters, voltage-controlled oscillators (VCOs), etc., low IMD characteristics is very beneficial since the lower the distortion attributed to these circuits, the lower the overall distortion of the components using the circuits (e.g., radios, television sets, etc.). A need thus exists for a variable impedance circuit which can provide for improved distortion performance.

SUMMARY OF THE INVENTION

Briefly, according to the invention, there is provided an electronic circuit comprising first and second vadable impedance devices. The first and second variable impedance devices are coupled to each other and said first and second variable impedance devices each have a transfer function that is substantially inverse to the other about the at least one operating point of the electronic circuit.

In another embodiment of the invention, an electronic circuit comprises first and second VVCs.

In still another embodiment of the invention, a communication device comprises an electronic circuit comprising first and second variable impedance devices, and said first and second variable impedance devices each have a transfer function that is substantially inverse to the other about the at least one operating point.

DETAILED DESCRIPTION OF THE PREFERRED EMBODIMENT

Figure 1:
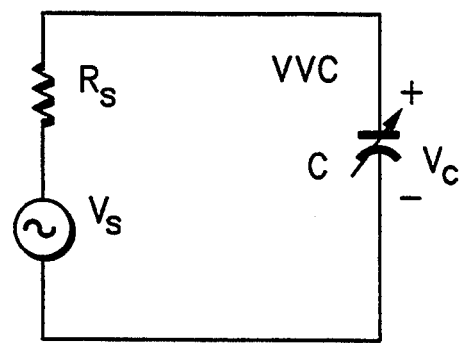
FIG. 1 is a schematic of a VVC in series with a voltage source.

While the specification concludes with claims defining the features of the invention that are regarded as novel, it is believed that the invention will be better understood from a consideration of the following description in conjunction with the drawing figures, in which like reference numerals are carried forward.

A VVC is a variable impedance device which exhibits a very large variation in capacitance versus voltage. Capacitance variation in the order of 50 to 1 can be exhibited in a VVC from the low to the high bias voltage settings. Due to the physical construction of a VVC, such as the VVC disclosed in U.S. Pat. No. 5,173,835, entitled "Voltage Variable Capacitor", issued to Cornett, et al., which is hereby incorporated by reference, this electrical property is achieved with no appreciable current drain penalty.

A model of a measurement circuit which will help in discussing the distortion behavior of a VVC is shown in FIG. 1. FIG. 1 shows a circuit representing a "lossless" VVC in series with a voltage source Vs and a source resistance Rs. Losses in the VVC can be added, but will not be considered in this analysis for simplicity. The circuit shown in FIG. 1 can be analyzed in two fashions, by voltage analysis or by current analysis. For brevity, this description will concentrate in describing the distortion in terms of the voltage across the VVC terminals. In order to find the voltage across the capacitor (C) shown in FIG. 1 as a function of the source voltage, an approximation is first made. The approximation, known as the weakly nonlinear approximation, assumes that the C-V (capacitance versus voltage) curve changes slowly with changes in bias voltage. Another way of interpreting the weakly nonlinear approximation is to assume that the intermodulation products are much smaller than the fundamental signal. With this approximation, the voltage across the capacitor can be expressed using a simple linear voltage divider relationship as follows:

$$V_c = V_s \frac{\frac{1}{j\omega C}}{R_S + \frac{1}{j\omega C}}$$

It is important to realize that "C" is still dependent on the source voltage $V_s$. For example, if one takes a voltage-variable capacitor having dimensions of 76 $\mu$m by 76 $\mu$m, the measured capacitance versus bias voltage is shown in FIG. 2.

Figure 2:
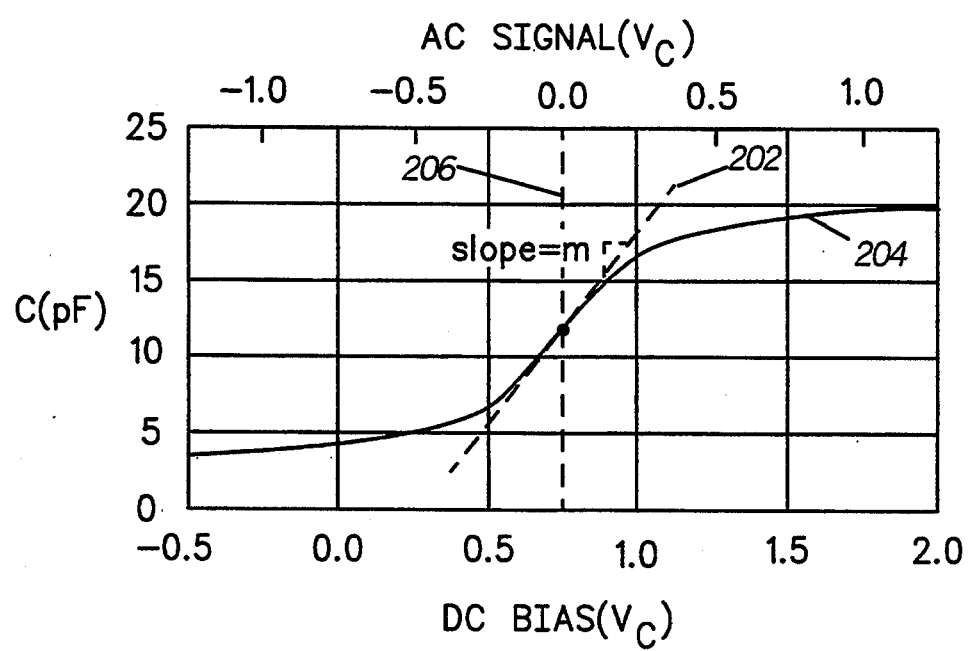
FIG. 2 is a graph showing the capacitance versus the DC bias voltage of a voltage variable capacitor.

Referring to FIG. 2, a linear approximation of the capacitance versus bias (C-V) curve 204 about an operating point, "$C_0$" (e.g., 12 pico-farads) is shown in line 202. To simplify the analysis, only the AC voltage across the capacitor is considered. The approximation yields for the voltage across the capacitor:

$$V_c^{total} = v_c + V_c^{DC}$$

where:
$v_c$ = AC signal voltage
$V_c^{DC}$ = DC bias voltage.

The linear C-V approximation can then be expressed in terms of the AC voltage only. The conceptual effect of using only AC voltages produces a coordinate transformation as shown in FIG. 2. The linear approximation, at the circuit's operating point $C_0$, then becomes:

$$C = mv_c + C_0$$

For a two terminal device, expressing the intercept point in terms of power is not very useful. This is due to the dependence of the power term on the impedance of the device under test. A more useful way of expressing the intercept point is in volts (IP3V). IP3V is defined as the voltage at which the magnitude of the fundamental voltage across the capacitor is equal to the magnitude of the IM voltage:

IP3V = $|v_c^{fund}| = |v_c^{im}|$, where $v_c^{fund}$ = voltage at fundamental frequency, and $v_c^{im}$ = voltage at the intermodulation frequency.

The IP3V can be calculated by first recalling that the power term can be expressed as:

$$P = 10 \log \left( \frac{|v_{rms}|^2}{|Z|} \right),$$

where P is equal to power, and "Z" is the impedance of the device under test. Assuming that:

$|Z(\omega_f)| \approx |Z(\omega_f + \Delta)|$, the IP3V can be shown to be equal to:

$$IP3V = \sqrt{\frac{|v_c^{fund}|^3}{|v_c^{im}|}}.$$

The formula above can be further reduced knowing the fundamental and offset signals which form the third-order IM product into:

$$IP3V = \frac{\sqrt{2(\omega^2 C_0^2 R_s^2 + 1)}}{\omega R_s |m| \sqrt{3}} \propto \frac{1}{|m|}.$$

The above linear approximation technique has shown that the third-order intercept point voltage (IP3V) is inversely proportional to the slope (m) of the C-V curve. This leads to the conclusion that a VVC like that shown in FIG. 1, would have its worst IM performance over it tuning range. Since IP3V is inversely proportional to The slope of the C-V curve, two identical VVCs with equal but opposite slopes would achieve improved IM performance. Traditionally, two varactors have been placed in series, or "back-to-back" configuration, with their anodes (or cathodes) connected. Although this series configuration does improve the IMD of the varactor pair, the configuration is not optimal. Placing the two VVCs in parallel, with the anode of the one connected to the; cathode of the other (antiparallel configuration), will theoretically eliminate all IMD, although some distortion will be seen due to practical circuit limitations.

Figure 3:
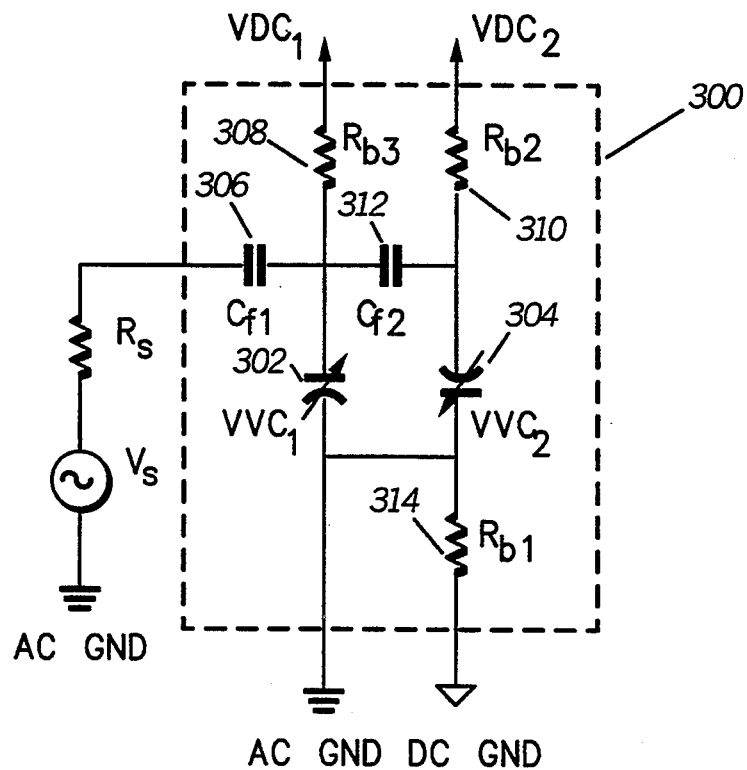
FIG. 3 is a schematic of a variable impedance circuit in accordance with the present invention.
Figure 4:
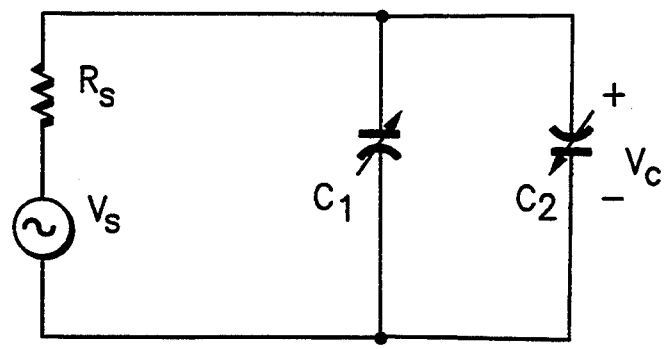
FIG. 4 is an AC equivalent schematic of the circuit shown in FIG. 3.

Referring to the schematic shown in FIG. 3, the DC biases are such that $C_1(V_1) = C_2(V_2)$ in the variable impedance section 300. The resistors $R_{b1}$, $R_{b2}$, and $R_{b3}$, and the capacitors $C_{f1}$ and $C_{f2}$ are part of the DC biasing network. $VCC_1$ 302 and $VVC_2$ 304 are chosen so that their C-V curves are identical. The AC equivalent circuit of the circuit shown in FIG. 3 is shown in FIG. 4. Looking at FIG. 4, it is easy to determine that the total capacitance of the circuit can be determined by the following formula:

$$C_{total} = C_1 + C_2 \quad (1)$$

but if $C_1$ and $C_2$ are identical, and have opposite DC polarity:

$$C_1 = -mv_c + C_0 \quad (2)$$
$$C_2 = mv_c + C_0$$

Therefore, the total capacitance equals:

$$C_{total} = (-mv_c + C_0) + (mv_c + C_0) = 2C_0.$$

The total capacitance is constant with respect to the source amplitude:

$$\frac{\partial C_{total}}{V_c} = m = 0$$

which yields a slope of zero. Applying the slope to the IP3V equation yields:

$$IP3V = \frac{\sqrt{2|2\omega j C_0 R_s + 1|^{1/2}}}{0} = \infty \quad (3)$$

The above formula shows that the IP3V of the antiparallel configuration is infinite, or, in other words, generates no IM products. The particular advantage of the parallel configuration is that $C_{total}$ is independent of the source voltage, unlike the "back-to-back" configuration of previous varactor designs. This independence allows improved IM performance over a single VVC or two VVCs in series.

Figure 5:
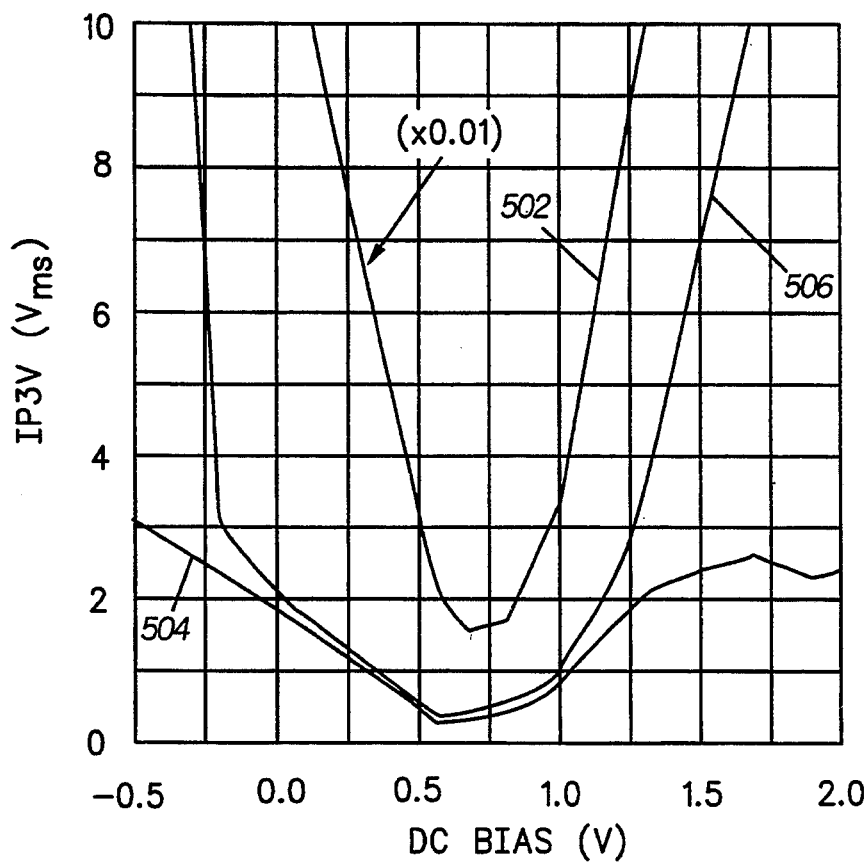
FIG. 5 is a graph of a harmonic balance simulation of the antiparallel configuration of FIG. 4.

A typical harmonic balance simulation of the parallel configuration of the circuit in FIG. 4, is shown in FIG. 5. This particular harmonic simulation was performed using a Microwave Design System available from Hewlett Packard, Inc. FIG. 5, also shows the measured 504 and calculated 506 IP3V curves of a single VVC. Special note should be taken that the antiparallel configuration curve 502 has a different scale (X0.01) than the other two curves, with the simulatect IP3V equaling 170v at its minimum.

The circuit shown in FIG. 3 was preferably constructed using packaged VVCs, and the distortion of the antiparallel VVC's was measured. The distortion of the circuit of FIG. 3 as measured was so small that even at the highest distortion bias point (~0.75v), the IM products were below the noise floor of the spectrum analyzer (−140 dBm) being used to take the measurements. Assuming that the IM products were just below the noise floor of the spectrum analyzer, then the corresponding IP3V would have a minimum value of 125V. This represents at least two orders of magnitude improvement in the distortion performance over the single VVC shown in FIG. 1.

The distortion analysis made above was made in the context of a linear C-V curve. However, such a zero distortion condition is not limited to a linear C-V profile. From formula (2), one can determine that the only condition necessary for zero distortion is that the C-V curves of the VVCs subtract to a constant capacitance value. In other words, if the capacitance as a function of AC voltage is defined as:

$$C(v) = f(v) + C_0 \quad (4)$$

then the necessary and sufficient condition for zero distortion is:

$$f(-v) = -f(v) \quad (5)$$

By definition, f(v), must be an odd function of v. With the constraint given above, formula (3) becomes:

$$C_{total} = (f(v) + C_0) + (f(-v) + C_0)$$

$$C_{total} = (f(v) + C_0) + (-f(v) + C_0) \quad (6)$$

$$C_{total} = 2C_0$$

If the constraint on the C-V curve of formula (5) does not hold over the complete voltage swing of the source, then the actual distortion will be non-zero.

Figure 6:
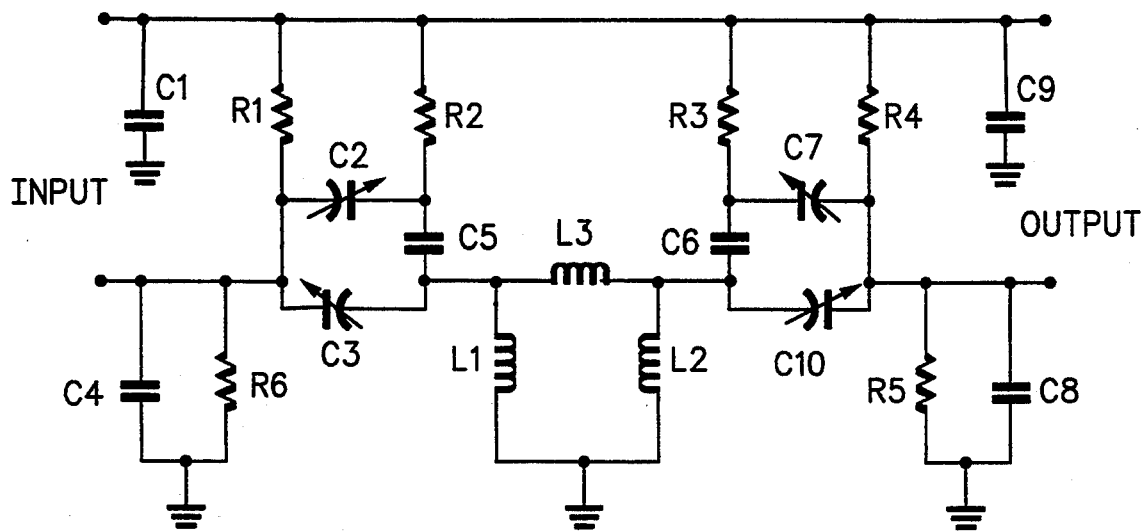
FIG. 6 is a schematic of a bandpass filter in accordance with the present invention.

In FIG. 6, there is shown a bandpass filter 600 in accordance with the present invention. Bandpass filter 600 utilizes a first set of VVC's comprising VVCs C2 and C3 and a second set comprising VVCs C7 and C10. The VVCs are coupled in parallel with their terminals reversed, and each set uses VVCs which have an inverse transfer function with respect to each other as described above. The use of VVCs C2, C3, C7 and C10 as described provides for a filter which shows very low distortion characteristics. Capacitor C5 is coupled between VVCs C2 and C3 and capacitor C6 is coupled between VVCs C7 and C10.

Figure 7:
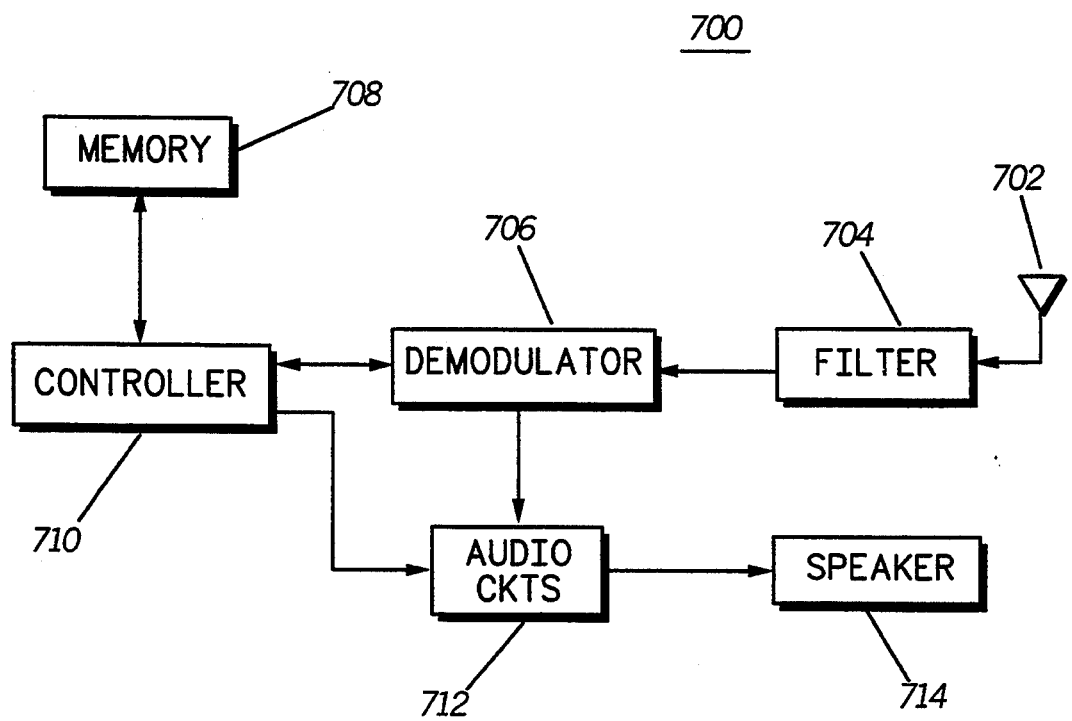
FIG. 7 is a block diagram of a communication device in accordance with the present invention.

In FIG. 7, a block diagram of a communication device such as a receiver 700 is shown in accordance with the present invention. Receiver 700 includes a filter section 704 used for filtering the radio frequency signal received by antenna 702. The filtered signals are sent to a demodulator 706 for demodulation of the received signals. A controller such as a microprocessor 710 and associated memory 708 control the overall operation of receiver 700. Audio circuits 712, which include an audio amplifier stage, amplifies and filters the demodulated signal for presentation to speaker 714. The variable impedance devices such as the VVCs discussed herein will preferably find application in the filter section 704, but may also find application in the demodulator 706 and audio circuits 712.

It has been shown in the preferred embodiment that by forming a circuit having two VVCs connected in parallel, with the VVCs having opposite C-V transfers (inverse transfer function about an operating point), distortion can be reduced in the circuit. The VVCs must have C-V curves that subtract to a constant value (e.g., "C" must be an odd function of "v") at the operating point, such as linear C-V curves. Although linear C-V curves meet the criteria, any type of curves (e.g., non-linear curves) will meet the criteria required as long as the two curves show an inverse transfer function about the operating point with respect to each other.

While the preferred embodiments of the invention have been illustrated and described, it will be clear that the invention is not so limited. For example, the same improvement in distortion can be achieved using inductors, etc. Numerous modifications, changes, variations, substitutions and equivalents will occur to those skilled in the art without departing from the spirit and scope of the present invention as defined by the appended claims.

What is claimed is:

1. An electronic circuit providing for reduced distortion characteristics, the electronic circuit having at least one operating point, the electronic circuit comprising:
   a first voltage variable capacitor having a positive and a negative terminal;
   a second voltage variable capacitor having a positive and a negative terminal; and
   the positive terminal of the first voltage variable capacitor is coupled to the negative terminal of the second voltage variable capacitor, and said first and second voltage variable capacitors each have a capacitance-to-voltage (C-V) curve about the at least one operating point and the curves when subtracted from each other yield a substantially constant capacitance value.

2. An electronic circuit as defined in claim 1, further comprising a capacitor coupled between the positive terminal of the first voltage variable capacitor and the negative terminal of the second voltage variable capacitor.

3. An electronic circuit as defined in claim 2, wherein the negative terminal of the first voltage variable capacitor is coupled to ground potential.

4. A filter, comprising:
   at least one input terminal for receiving a signal;
   a variable capacitance section having at least one operating point coupled to the at least one input terminal, comprising:
     a first variable capacitance device having a positive and a negative terminal, the positive terminal of the first variable capacitance device is coupled to the input terminal;
     a second variable capacitance device having a positive and a negative terminal:
     the positive terminal of the first variable capacitance device is coupled to the negative terminal of the second variable capacitance device and said first and second variable capacitance devices each have a capacitance-to-voltage (C-V) curve about the at least one operating point and the (C-V) curves when subtracted from each other yield a substantially constant capacitance value; and
   at least one output terminal coupled to the variable capacitance section for providing the signal after it has been filtered.

5. A filter as defined in claim 4, wherein the first and second variable capacitance devices are voltage variable capacitors.

6. A filter as defined in claim 5, further comprising a capacitor coupled between the positive terminal of the first voltage variable capacitor and the negative terminal of the second voltage variable capacitor.

7. An filter as defined in claim 6, wherein the negative terminal of the first voltage variable capacitor is coupled to ground potential.

* * * * *